(12) United States Patent
Giubbini et al.

(10) Patent No.: US 8,791,688 B2
(45) Date of Patent: *Jul. 29, 2014

(54) METHOD AND APPARATUS FOR DETECTING THE PHASE WIRING OF ANY ARBITRARY UNKNOWN PHASE VOLTAGE RELATIVE TO A REFERENCE PHASE VOLTAGE

(75) Inventors: Paolo Giubbini, Rome (IT); Fabio Veroni, Vimercate-Milano (IT)

(73) Assignee: Enel Distribuzione S.p.A., Rome (IT)

( * ) Notice: Subject to any disclaimer, the term of this patent is extended or adjusted under 35 U.S.C. 154(b) by 420 days.

This patent is subject to a terminal disclaimer.

(21) Appl. No.: 13/196,362

(22) Filed: Aug. 2, 2011

(65) Prior Publication Data

US 2011/0285379 A1 Nov. 24, 2011

Related U.S. Application Data

(63) Continuation of application No. 11/597,518, filed as application No. PCT/EP2004/005616 on May 25, 2004, now Pat. No. 8,013,592.

(51) Int. Cl.
G01R 29/18 (2006.01)
G01R 25/00 (2006.01)

(52) U.S. Cl.
CPC .............. *G01R 29/18* (2013.01); *G01R 25/00* (2013.01)
USPC ........................................ 324/76.77; 324/66

(58) Field of Classification Search
CPC ................. G01R 29/18; G01R 25/00
USPC .......................................... 324/76.77, 84, 66
See application file for complete search history.

(56) References Cited

U.S. PATENT DOCUMENTS

| 3,940,558 A | 2/1976 | Gabbard et al. |
| 4,514,719 A | 4/1985 | Suzuki et al. |

(Continued)

FOREIGN PATENT DOCUMENTS

| DE | 4405809 | 8/1995 |
| EP | 0793109 A1 | 3/1997 |

(Continued)

OTHER PUBLICATIONS

U.S. Appl. No. 11/597,518, filed Dec. 12, 2007; Inventor: Giubbini et al.

(Continued)

*Primary Examiner* — Jeff Natalini
(74) *Attorney, Agent, or Firm* — Nixon & Vanderhye P.C.

(57) ABSTRACT

The technology relates to detecting the wiring phase of an unknown phase voltage relative to a reference phase voltage in an electric power distribution system having a polyphase power line. In order to reliably detect the wiring phase at the remote location relative to a reference wiring phase even if the remote location is at a larger distance from the reference location, at least one relay location is arranged between the reference location and the remote location and connected to the wiring phase of the polyphase power line. A first phase relation is detected between the reference wiring phase voltage at the reference location and the wiring phase voltage at the relay location. A second phase relation is detected between the wiring phase voltage at the relay location and the wiring phase voltage at the remote location. The wiring phase of the remote location relative to the wiring phase at the reference location is detected based on the first phase relation and the second phase relation. The technology is advantageous in that a direct communication channel between the remote location and the reference location for detecting the phase relation is not required.

29 Claims, 5 Drawing Sheets

(56) References Cited

U.S. PATENT DOCUMENTS

| | | | |
|---|---|---|---|
| 4,626,622 | A | 12/1986 | Bouvrette |
| 5,012,182 | A | 4/1991 | Fujiki et al. |
| 5,510,700 | A | 4/1996 | Pomatto |
| 5,521,491 | A | 5/1996 | Najam |
| 5,617,329 | A | 4/1997 | Allison et al. |
| 6,130,531 | A | 10/2000 | Hao |
| 6,545,481 | B1 | 4/2003 | Emberty et al. |
| 6,734,658 | B1 | 5/2004 | Bierer |
| 7,031,859 | B2 | 4/2006 | Piesinger |
| 7,598,720 | B2 | 10/2009 | Veroni et al. |
| 8,283,911 | B1 * | 10/2012 | Bierer .................. 324/66 |
| 2003/0016631 | A1 | 1/2003 | Piner et al. |
| 2003/0161391 | A1 | 8/2003 | Andre et al. |
| 2003/0169029 | A1 | 9/2003 | Piesinger |
| 2003/0184275 | A1 | 10/2003 | Slade et al. |
| 2005/0069171 | A1 | 3/2005 | Rhoads et al. |
| 2010/0134089 | A1 * | 6/2010 | Uram et al. .............. 324/66 |

FOREIGN PATENT DOCUMENTS

| | | |
|---|---|---|
| JP | 10-507852 | 7/1998 |
| JP | 2000-507343 | 6/2000 |
| JP | 2001-215248 | 8/2001 |
| TW | 380206 | 5/1998 |
| TW | 388795 | 5/2000 |
| WO | WO 96/06478 | 2/1996 |
| WO | WO 01/11799 | 2/2001 |
| WO | WO 2005/116668 | 8/2005 |

OTHER PUBLICATIONS

U.S. Appl. No. 11/659,704, filed Feb. 8, 2007; Inventor: Veroni et al.
Office Action mailed Nov. 15, 2010 in co-pending U.S. Appl. No. 11/597,518.
Office Action mailed Jun. 8, 2010 in co-pending U.S. Appl. No. 11/597,518.
Office Action mailed Oct. 31, 2008 in co-pending U.S. Appl. No. 11/659,704.
Office Action mailed Feb. 27, 2008 in co-pending U.S. Appl. No. 11/659,704.
International Search Report of PCT/EP2004/005616, mailed Feb. 22, 2005.
Translation of Mexican official action, Apr. 8, 2009, in Mexican Application No. PA/a/2006/013819.
Technical Report, CEI/IEC 61334-5-2, May 1998.
Japanese official action (and English summary) mailed May 20, 2011 in corresponding Japanese Application No. JP 2007-513690.
Seiji Higashi et al., "Application of Optical IP Communication System for Line Switch Control", Proceedings of the Conference of Power & Energy Society, The Institute of Electrical Engineers of Japan, Aug. 6, 2003, vol. 14, Part A, pp. 443-444. No English translation.
Indian First Examination Report, Mar. 28, 2011, in corresponding Indian Application No. 3671/KOLNP/2006.
Summary of Japanese official action, Mar. 26, 2010, in corresponding Japanese Application No. 2007-513690.

* cited by examiner

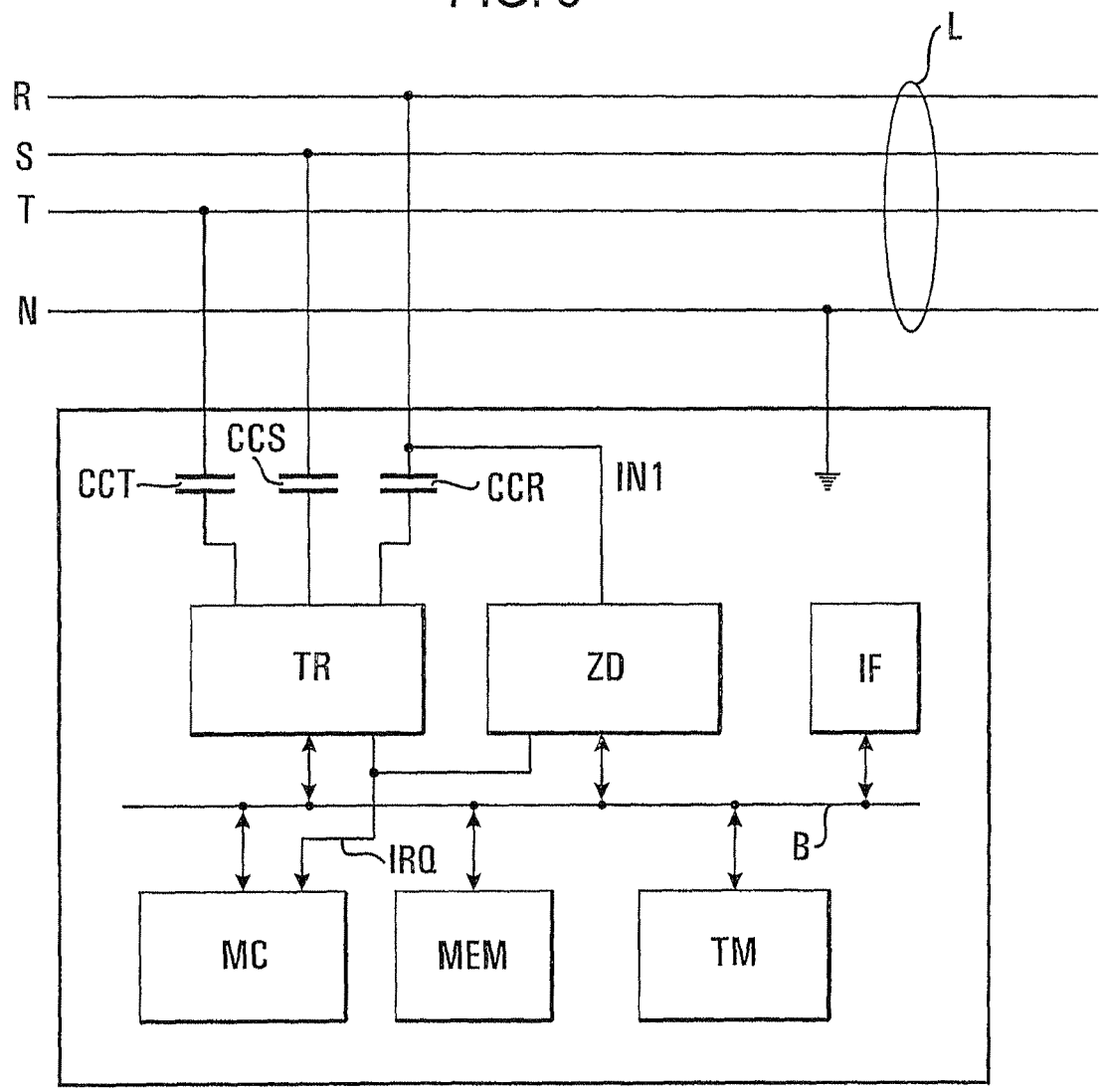

METHOD AND APPARATUS FOR DETECTING THE PHASE WIRING OF ANY ARBITRARY UNKNOWN PHASE VOLTAGE RELATIVE TO A REFERENCE PHASE VOLTAGE

CROSS-REFERENCES TO RELATED APPLICATIONS

This application is a continuation of U.S. application Ser. No. 11/597,518, filed on Nov. 27, 2006 now U.S. Pat. No. 8,013,592, which claims priority from the US national phase of international application PCT/EP/2004/005616, filed May 25, 2004, which designated the U.S., the entire contents of which are hereby incorporated by reference.

The technology relates to a method and an apparatus for detecting the wiring phase of an unknown phase voltage relative to a reference phase voltage in an electrical power distribution system having a poly phase power line.

Modern power distribution systems use poly phase power lines for distributing electricity. A poly phase power line comprises a plurality, typically three, conductors, each conductor carrying a specified phase voltage. As is well known, a poly phase power line may or may not have a neutral conductor which, if present, constitutes an additional conductor of the poly phase power line. Moreover, in addition to these conductors of a typical poly phase power line, there may or may not be a further conductor which carries the ground potential.

While a poly phase power line offers many advantages for certain types of loads, e.g. electrical machines employing rotating magnetic fields, there are many electrical consumers which are not connected to all the phases available in a given poly phase power line. For many types of loads it is sufficient that the load is connected between two of the phases, or more typical, between one of the available phases and the neutral conductor. This wiring scheme is widely spread particularly in the low voltage networks used for supplying consumer appliances with electricity in the domestic domain. In Europe, the low voltage power distribution network has three wiring phases, each at a voltage of 220 Volt to 240 Volt to neutral, the three phases being spaced apart at an angle of 120°. Particularly in the domestic domain, most electrical loads are connected between one of the three wiring phases R, S, T and the neutral conductor N, the particular phase R or S or T to which the load is actually connected, being insignificant for most types of single phase applications and loads, and therefore typically unknown.

In some cases it is, however, desirable to detect the phase to which a given load is connected. For example, in a power line communication system that uses the existing power line distribution network for telecommunication purposes, it may be highly desirable for the transmitter to know the phase voltage to which the receiver is connected, because it may be expected that the communication between the transmitter and the receiver via a power line is better if the transmitter and the receiver are connected to the same phase voltage than if the transmitter and the receiver communicates with each other across different phases through capacitive or inductive cross talk between the phases.

In an electricity metering system for metering the electric energy consumed by a plurality of consumers, there are good reasons to detect the wiring phase of an electricity meter located inside or outside of the consumer premises. For example, the detection of the wiring phase allows to judge whether a consumer has unlawfully rewired the electricity meter in order to prevent the meter from correctly measuring the consumed energy. If the meters communicate with other nodes in a remote metering system through power line communication, the knowledge of the phase to which the respective remote meters at the consumer premises are connected, is valuable information for optimising the communication performance of the remote metering system as a whole.

From U.S. Pat. No. 4,626,622 it is known to identify an unknown phase within a poly phase network by comparison of the unknown phase with a known reference phase of the poly phase network. The system comprises a first device connected to the reference phase and a second device connected to the unknown phase at another location. The first and second devices each comprise a modem for establishing a telephone connection between the two devices. The first device includes circuitry to produce a digital signal representative of the alternating voltage of the reference phase. This representative signal is transmitted through the two modems and the telephone connection from the first to the second device. The second device includes a phase detection circuit for identifying the unknown phase by detecting the phase angle between the alternating voltage of the reference phase and the alternating voltage of the unknown phase.

While the method and system known from this document is suitable to carry out the identification of the unknown phase when the reference location of known wiring phase at a point of the poly phase network, e.g. the outlets of a substation transformer, is far from the location where the phase is unknown, this method and system has the drawback that a separate telephone connection between the first and the second devices is required. In many cases, a separate telephone connection is not available.

The IEC 61334-5-2 defines a method for identifying an unknown phase within a poly phase network by means of injecting a short data packet or time stamp signal into the poly phase network when a first reference point, e.g. a zero crossing, occurs in the reference phase voltage. The poly phase network itself serves to communicate the short data packet or time stamp signal to the location where the unknown phase has to be identified. At the location of the unknown phase, the short data packet or time stamp signal is extracted from the poly phase power line, and a time interval between the occurrence of the short data packet or time stamp signal and a reference point, e.g. a zero crossing in the unknown phase voltage is measured. That time interval is then indicative of the phase angle between the reference phase and the unknown phase. The phase angle thus determined allows to identify the unknown phase wiring.

While the phase identification method defined in this standard does not require a separate telephone line between the location of known phase and the location of unknown phase, this method suffers from the drawback that power line communication generally has a limited range only. The electrical characteristics of power lines are not ideally suited for transmitting communication signals. Moreover, many electrical loads connected to power lines tend to generate a significant noise floor such that already at moderate distances from the location of the transmitter, the signal to noise ratio for detecting the short data packet or time stamp signal becomes unacceptably low. This limits the use of the phase detection method according to the IEC standard.

Accordingly, it is an object, to provide a method and apparatus for detecting the wiring phase of an unknown phase voltage relative to a reference phase voltage in an electrical poly phase power distribution system, which method and device allow to detect the wiring phase even if the location of unknown wiring phase is at a larger distance from the known reference phase and a direct communication channel connecting the location of known phase and the location of unknown wiring phase is not available.

According to an example embodiment, in order to detect the wiring phase of an unknown phase voltage at a remote location relative to a reference phase voltage (R) at a reference location in an electrical power distribution system having a single phase or poly phase power line (R, S, T, N), at least one relay location to relay signals between said reference location and said remote location is arranged between said reference location and said remote location and connected to a wiring phase of the poly phase power line. A first phase relation is detected between the reference wiring phase at the reference location and the wiring phase at a said relay location. Moreover, a second phase relation is detected between the wiring phase at the relay location and the wiring phase at the remote location. Based on the first and second phase relation the wiring phase of the remote location relative to the reference wiring phase may be obtained.

The first phase relation can be obtained in a number of different ways. If a new node at a remote location is newly added to extend an existing network, a previously existing node of the network may take the function of a relay location for which the wiring phase is already known from a previous detection. In this case it is sufficient that the relay location performs the detection of the second phase relation between the wiring phase at the relay location and the newly added remote location. The wiring phase at the remote location can then be determined at the remote location or at the relay location on the basis of the second phase relation thus detected and the already known wiring phase of the relay location, or the relay location transmits the detected second phase relation to the reference location where the wiring phase of the remote location may be determined using the knowledge of the wiring phase of the relay location.

If the at least one relay locations between the reference location and the remote location have unknown arbitrary wiring phases, it may be advantageous to detect a first phase relation between the wiring phase at the reference location and the wiring phase at the relay location, and transmit it toward said remote location. A second phase relation between said relay location and said remote location is detected. Based on said first phase relation and said second phase relation, the wiring phase at said remote location relative to the wiring phase at the reference location can be detected.

Advantageously, the locations may be nodes of a network using the power line as a communication signal transmission medium.

According to an example embodiment, the wiring phase of an unknown phase voltage relative to a reference phase voltage in an electrical power distribution system having a single phase or poly phase power line is detected by transmitting from a reference location a first time stamp signal when a first reference point in the reference phase voltage occurs. The first time stamp signal is received at a relay location where a first time interval is measured between the occurrence of the first time stamp signal and the occurrence of a reference point in a first arbitrary wiring phase of the power line, to obtain first phase relation information indicative of a phase relation between the reference phase voltage and the first arbitrary phase voltage. From the relay location a relay message is transmitted which comprises this phase relation information. Moreover, from the relay location a relay time stamp signal is transmitted when a second reference point in the first arbitrary phase voltage occurs According to this embodiment, the generation of a relay time stamp signal together with a relay message comprising said phase relation information allows to relay at the relay location the reference phase information to a remote location, without there being a need for a direct communication channel between the reference location and the remote location.

The relay location may be followed by additional relay locations to bridge even larger distances between the reference location and the remote location. Advantageously, a further relay at a third location receives the relay time stamp signal and the relay message from the preceding relay location and measures a second time interval between the occurrence of the relay time stamp signal and the occurrence of a reference point in a second arbitrary phase voltage at the third location to obtain second phase relation information indicative of a phase relation between the wiring phase voltages at the consecutive relay locations. At the third location, the second phase relation information and the first phase relation information that was received from the preceding relay location, is then combined. The combined phase relation information is indicative of the phase relation between the reference phase voltage and the wiring phase voltage at the third location. This information can be transmitted to the further location in the form of a further relay message, or this information can be used to determine the unknown wiring phase at the third location.

The term 'reference location' may refer to a location or node where the wiring phase of the power line is known, be it simply by definition, as would be the case at the outlet of a three phase transformer. The term remote location then refers to a location or node where the wiring phase is unknown. It has to be noted, however, that in the alternative, the term 'reference location' may also refer to a location or node where the wiring phase is unknown and the term 'remote location' refers to a location or node where the wiring phase is known. In the embodiment described above, the combined phase relation between adjacent locations is taken along to the remote location. It does not make a principal difference for detecting an unknown wiring phase whether this phase relation is taken along in the direction from the location with the known wiring phase to the location with the unknown wiring phase or in the opposite direction. In the former case the information required to determine the unknown wiring phase is available at the location of unknown wiring phase, while in the latter case this information is available at the location of known wiring phase.

The phase relation information can be represented in terms of time, in terms of phase angles or in terms of 'hops' between consecutive phases to be distinguished in the phase diagram which describes the polyphase system. In a three phase system each hop would correspond to a phase angle of 120°. If there is a need to also detect reverse wiring, then in a three phase system there would be six different wiring possibilities to be distinguished, and each hop would correspond to 60° because in this case there are three normal phases plus another three reverse phases to be considered.

The phase relation information in a received relay message and the phase relation information obtained from measuring the time interval between the received time stamp signal and a reference point in a wiring phase voltage at the receiver location can be combined in a variety of ways, and preferably by simply adding the respective time intervals, associated phase angle values or number of hops. This addition may advantageously be a modulo M addition. If the phase relation information is represented in terms of time, then M denotes the period of the alternating voltage carried on the poly phase power line. If the phase relation information is represented in terms of phase angles, M denotes the phase angle value associated with a full cycle, that is $2\pi$ or 360°. If the phase relation information is represented in terms of a number of hops between the phases, then M denotes the number of wiring phase possibilities to be distinguished in the poly phase system.

Preferably, the time interval between the occurrence of a time stamp signal and the occurrence of a reference point is measured redundantly in order to increase the reliability of the final measurement result. Preferably, for measuring a particular time interval, the transmitter transmits more than one time stamp signals, each time stamp signal being synchronized with a reference point in the phase voltage of the transmitter. This enables the receiver to repeat the measurement of the time interval between the time stamp signal and the occurrence of a reference point in the phase voltage of the receiver in order to decide the measured time interval based on a majority vote, and/or to inform the transmitter of a time interval measurement failure if a clear majority vote is not achieved.

Advantageously, the same relays which relay the time stamp signal and phase relation information, may be used to relay a return message from the remote location of unknown phase wiring to the reference phase location in order to inform the reference phase location of the detected wiring phase at the remote location.

Preferably, the respective reference points in the reference phase and in the arbitrary wiring phases at the respective relay location(s) and remote location are predetermined repetitive events which occur with a period T which is the alternating voltage period of the poly phase power distribution network, e.g. 20 ms in case of a 50 Hz system. Zero crossings of the respective phase voltages with a slope of specified sign are particularly suitable as reference points.

A time stamp signal may be a short burst or any kind of suitable data packet or symbol sequence that is short in comparison with the phase voltage period T divided by the number of wiring phase possibilities to be distinguished. The time stamp signal can also be a phase discontinuity and/or an amplitude discontinuity in a more complex signal, bit sequence or message signal.

Preferably, in a poly phase system with an odd number N of phases, the phase relation information is mapped onto 2N different wiring phases, for example at a spacing of 60° if N=3, in order to take account of the possibility that at a relay location or at the remote location with the unknown phase wiring, a particular phase may be connected with reversed polarity. This feature may be particularly useful in remote electricity metering applications in order to detect a wiring error or unlawful rewiring of the remote meter at the consumer premises.

The time stamp signals and messages generated at the various locations may preferably be transmitted from one location to the next by means of power line communication, or by means of any other communication technology which offers a communication range sufficient to bridge the distance to the next relay location, for example optical cable or radio communication. If power line communication is used for transmitting the time stamp signals and messages from one location to the next, these signals may be injected into all the N phases of the poly phase power line, or it may be sufficient to inject these signals into a single phase only, due to the rather strong capacitive and inductive coupling that exists in a typical poly phase power line between the various phases. In applications with—a large number of available relay locations, e.g. in a remote electricity metering system with a considerable number of consumers connected to the same low voltage network section, blue tooth communication or any other limited range radio communication can be a suitable communication technology between the various consecutive locations up to the remote location the phase wiring of which is to be detected.

An embodiment of a relay apparatus for detecting the phase wiring of an arbitrary unknown phase voltage comprises a circuit for receiving a first time stamp signal, a circuit for measuring a time interval between the occurrence of said time stamp signal and the occurrence of a reference point in an arbitrary wiring phase voltage of said power line to obtain phase relation information indicative of a phase relation between said time stamp signal and said arbitrary phase voltage, a circuit for generating and transmitting a relay message which comprises said phase relation information, and a circuit for generating and transmitting a relay time stamp signal when a second reference point in said arbitrary phase voltage occurs. The relay apparatus according to this embodiment preferably also comprises a circuit for receiving phase relation information attributed to said first time stamp signal, which phase relation information may be in the form of a relay message from a relay apparatus at a preceding relay location. The circuit for generating a relay message then preferably combines the received phase relation and the phase relation information obtained from measuring the time interval, to generate the relay message such that it comprises the combined phase relation information.

According to a further example embodiment, an apparatus for detecting the phase wiring of an arbitrary unknown phase voltage comprises a circuit for receiving a time stamp signal, a circuit for measuring a time interval between the occurrence of the time stamp signal and the occurrence of a reference point in said arbitrary unknown wiring phase voltage to obtain phase relation information indicative of a phase relation between said time stamp signal and said arbitrary unknown phase voltage, a circuit for receiving a relay message comprising phase relation information indicative of a phase relation between the reference phase and the time stamp signal, and a circuit for combining the phase relation information indicative of a phase relation between the time stamp signal and said arbitrary unknown phase voltage and said received phase relation information, as well as a circuit for determining the phase wiring of said unknown arbitrary phase voltage from said combined phase relation information. An apparatus according to this embodiment of the present information is able to communicate with a preceding relay location in order to determine the phase wiring of the unknown arbitrary phase voltage at the location of the apparatus.

A particularly advantageous example application resides in the field of remote metering the consumption of electricity distributed to a large number of consumers through a public electricity distribution system. A remote metering system of this kind may comprise a concentrator located e.g. at a secondary substation for transforming the voltage carried on the medium voltage distribution network, e.g. 20 kV, into a low voltage, e.g. 230 V. The secondary sub station feeds a low voltage polyphase network to which a plurality of consumers is connected. Each consumer has an electricity meter capable of communicating with the concentrator of the network section to which it is connected. In order to assist the concentrator in detecting the wiring phase of the remote meters connected to its low voltage network section, each remote meter preferably comprises a relay apparatus and/or an apparatus for detecting the phase wiring of an arbitrary unknown phase voltage In the following, advantageous example embodiments will be described with reference to the accompanying drawings.

The following description serves to illustrate particular example embodiments which shall, however, not be construed to limit the claims.

FIG. 5 shows a block diagram of a node forming part of the system shown in FIG. 1;

Figure 1:
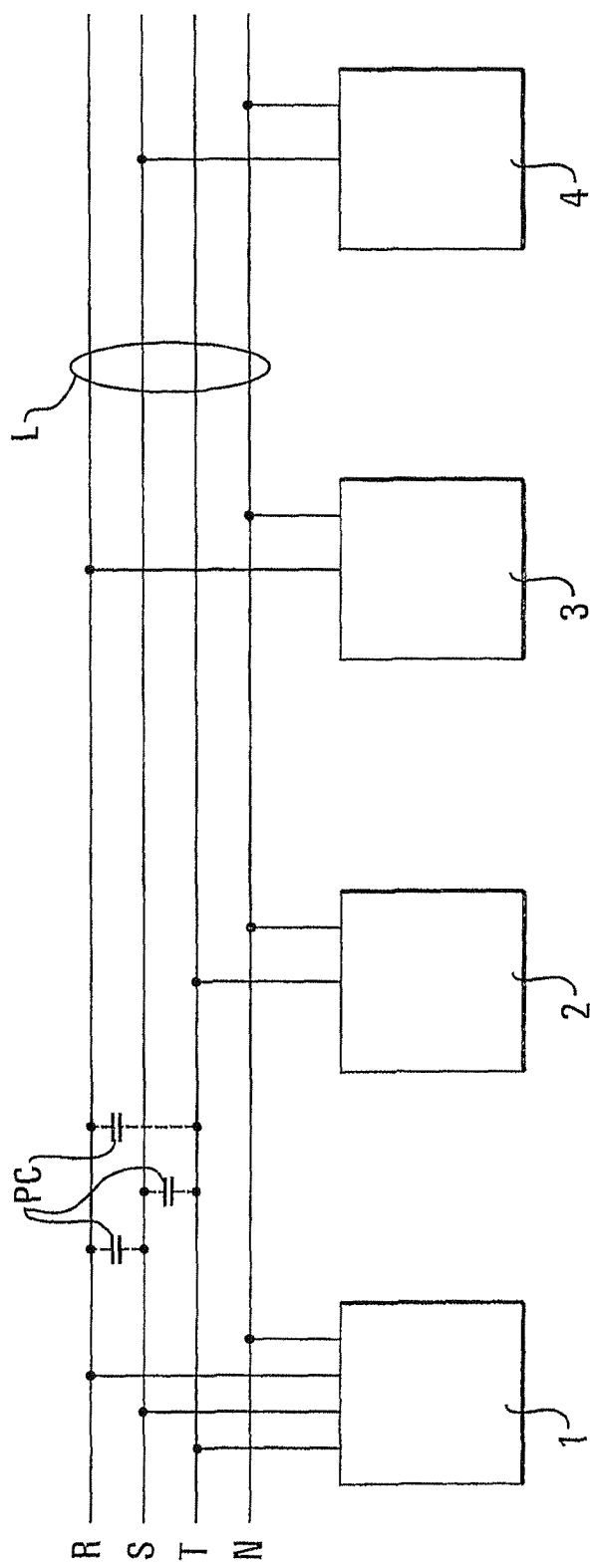
FIG. 1 shows the outline of a system for detecting the wiring phase of an unknown phase voltage in an electrical power-distribution system.

FIG. 1 shows the outline of a system for detecting the wiring phase of an unknown phase voltage in an electrical power distribution system. In FIG. 1, L denotes a poly phase power line as a part of an electrical power distribution system. The poly phase power line L in FIG. 1 is a three phase power line having three phases denoted as R, S and T, as well as a neutral conductor N. Between any two of the three phases R, S and T there is a phase shift of 120°, as is well known for three phase power distribution systems. PC in FIG. 1 denotes parasitic distributed coupling capacitances between the three phases R, S and T of the poly phase power line L Reference numeral 1 denotes a node connected to the power line L at a first location. In the embodiment of FIG. 1, the node 1 is connected to all the three phases R, S and T as well as to the neutral conductor N of the power line L in order to be able to inject and extract power line communication signals into and from the power line L, although due to the parasitic capacitive coupling between the three phases it would, be sufficient to connect the node 1 to less than all the three phases. The node 1 uses one of the three phases R, S and T as a reference phase. Any one of the available phases R, S and T may be chosen at node 1 as a reference phase. Without any loss of generality it may be assumed that R denotes the reference phase in the wiring phase detection system shown in FIG. 1.

Reference numerals 2 and 3 in FIG. 1 denote relay nodes connected to arbitrary, a priori unknown phases of the poly phase power line L. In the example shown in FIG. 1, relay node 2 is connected between phase T and neutral N, while relay node 3 is connected between phase R and neutral N. The wiring phase of these relay nodes is arbitrary in the sense that any of the available phases of the power line L may be used, without a need to know in advance which of the phases the node is connected to. It has to be noted that although a poly phase power line is shown in this embodiment, the technology described is not limited to wiring phase detection for poly phase power lines. In case of a single phase power line it may be interesting to detect reverse wiring of a consumer at a remote location. The technology described is also applicable to single phase systems.

Reference numeral 4 denotes a node connected to an unknown arbitrary phase of the poly phase power line L. The node 4 may be any kind of apparatus or circuit for which the information is of interest to which of the three phases R, S and T it is connected. As an example, the node 4 may be a single phase or poly phase electricity meter for which it is desired to detect its wiring phase(s) relative to the reference phase R, e.g. in order to be able to detect errors or fraud in the way the meter is connected to the poly phase power line L, and/or in order to use the remote meter 4 as a node in power line communication applications like remote metering of electricity in an optimised way.

In the embodiment shown in FIG. 1, there is no need for a direct communication channel between the reference location of node 1 and the remote location of the node 4 the wiring phase of which is to be detected. In order to be able to perform this detection, the nodes 2 and 3 act as relays. The operation of this system of FIG. 1 will be explained in the following making reference to FIG. 2.

Figure 2:
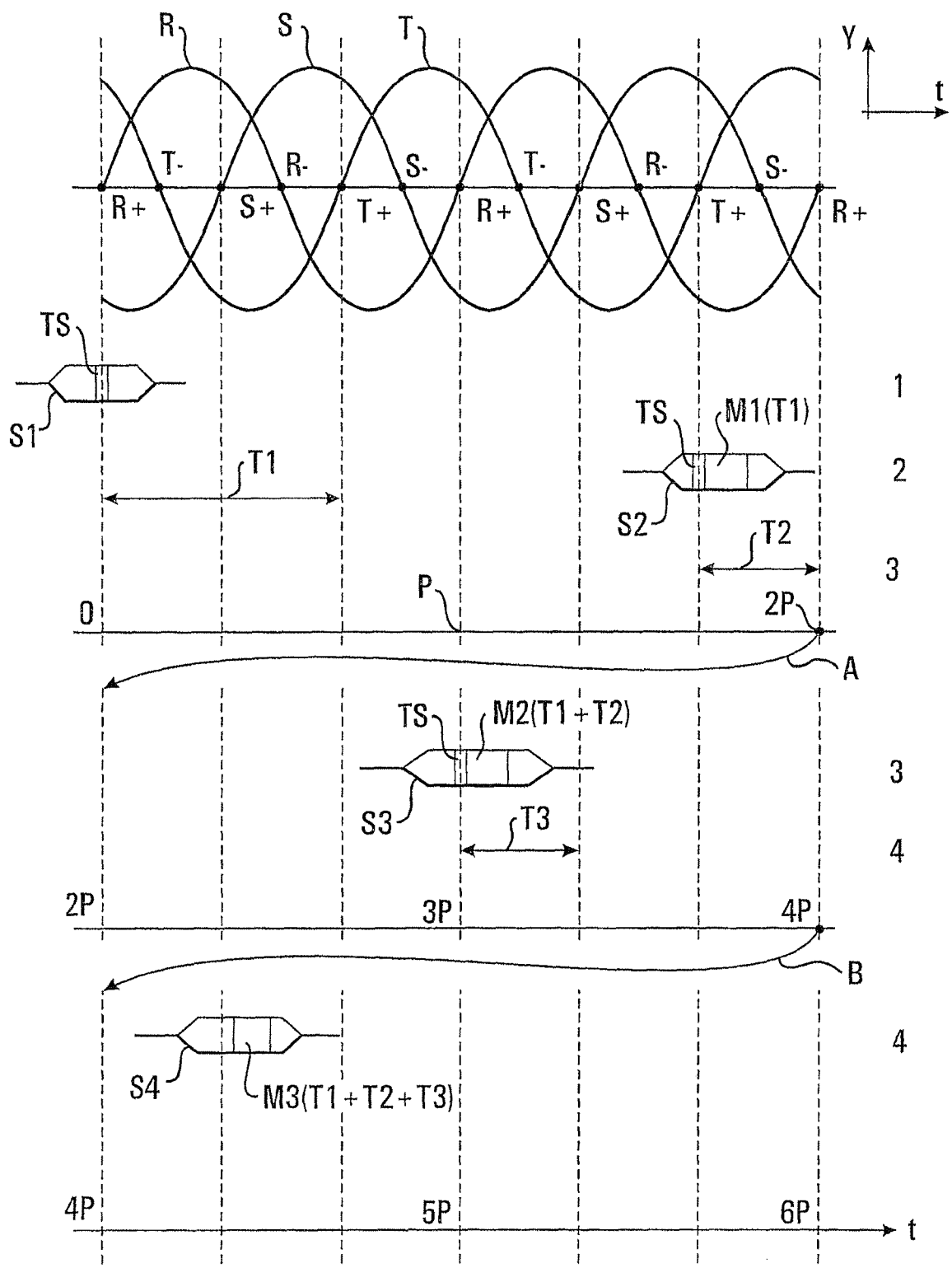
FIG. 2 shows a time diagram for illustrating the operation of the wiring phase detection system shown in FIG. 1 according to an example embodiment.

FIG. 2 shows a time diagram for illustrating the operation of the wiring phase detection system shown in FIG. 1 according to an example embodiment.

The upper portion of FIG. 2 shows the three phase voltages R, S and T over time. As shown, the three phase voltages are sign waves with the phase voltage S being 120° behind the phase voltage R, and the phase voltage T being 120° behind the phase voltage S and thus 120° ahead of the phase voltage R. Each of the three phase voltages have two zero crossings per cycle, that is one zero crossing per cycle with a specified slope. In the diagram of FIG. 2, the zero crossings with a positive slope are denoted R+, S+ and T+, respectively, while zero crossings with a negative slope are denoted with R−, S− and T−, respectively. In the embodiment shown, zero crossings with a positive slope in the respective phase voltages R, S and T have been chosen to serve as reference points of the respective phase voltages. In FIG. 2, the horizontal axis t denotes the time axis, while the dashed lines in the vertical direction Y in FIG. 2 correlate various events shown in FIG. 2 with certain points of the phase voltages R, S and T, as will be explained in detail in the following. The arrows A and B in FIG. 2 indicate that for reasons of space on the drawing sheet, the time axis has been drawn in three portions one above the other. The two points connected by the arrow A are actually coincident on the time axis. The same applies for the two points connected by the arrow B. P denotes the alternating voltage period in the three phase voltages R, S and T which is 20 ms in case of a 50 Hz system. The numerals 1 to 4 in the right hand portion of FIG. 2 refer to the nodes 1 to 4 in FIG. 1 to indicate the location where the respective events depicted in FIG. 2 take place.

In order to perform the detection of the wiring phase of node 4 in FIG. 2, the node 1 connected to the reference phase R sends a message S1 with a time stamp TS therein essentially coinciding with a zero crossing R+ of the reference phase R. The embodiment shown in FIG. 1 uses power line communication to transmit this time stamp TS in the message S1 of node 1 to the relay node 2. The relay node 2 receives the message S1 with the time stamp TS and measures a time interval, denoted Ti in FIG. 2, between the received time stamp TS in the message SI and the occurrence of a reference point T+ in the arbitrary phase voltage T to which the node 2 is connected. The node 2 then takes the measured time interval T1 to generate a message M1(T1) which contains the information about a phase relation between the received time stamp signal TS in the message S1 and the wiring phase of the node 2. The node 2 generates a message S2 which contains a time stamp signal TS coinciding with the occurrence of another reference point T+ in the phase voltage of the wiring phase T of node 2. The message S2 generated and transmitted by the node 2 via the power line L furthermore comprises the phase relation information message M1(T1).

The message S2 is received at the relay node 3, and the relay node 3 then measures a time interval, denoted T2 in FIG. 2, between the received time stamp TS in the message S2 from the node 2, and the occurrence of a reference point R+ in the phase voltage to which the node 3 is connected. In this example the time interval T2 reaches from T+ to R+.

At node 3, the phase relation information M1(T1) contained in the message S2 and the measured time interval T2 is suitably combined to obtain combined phase relation information as will be exemplified in more detail below. Node 3 then generates a message S3 which comprises a time stamp TS as well as the combined phase relation information M2(T1+T2). This message S3 is transmitted by the node 3 via the power line L at a timing such that the time stamp TS coincides with a subsequent reference point R+ on the phase voltage R to which the node 3 is connected in the embodiment shown.

At the node 4, the message S3 containing the time stamp TS is received, and the node 4 measures a time interval, denoted T3 in FIG. 2, between the time stamp TS in the message S3 and a reference point S+ in the phase voltage S to which the node 4 is connected. The combined phase relation information M2(T1+T2) in the message S2 and the time interval T3 is sufficient for node 4 to determine is wiring phase relative to the wiring phase of the reference node 1. Node 4 can determine its relative wiring phase by combining the phase relation information M2(T1+T2) in the received message S3 and the measured time interval T3. Node 4 may then generate a return message S4 which contains a message M3(T1+T2+T3) with the phase relation information thus combined. This message S4 may be relayed via the nodes 3 and 2 back to the node 1 to inform the node 1 about the wiring phase of the node 4.

In the embodiment shown, the phase relation information obtained for measuring the respective time intervals T1, T2 and T3 is preferably expressed in terms of an integer obtained by mapping the measured time interval T1, T2 and T3, respectively, onto one of N integers, N being the number of wiring phase possibilities to be distinguished in the wiring phase detection. This mapping operation corresponds to dividing the measured time interval by P/N. In the embodiment shown in FIG. 2, three wiring phase possibilities are considered, such that N=3. Accordingly, in the depicted example T1 is mapped onto 2 (two), T2 is mapped onto 1 (one) and T3 is mapped onto 1 (one). The integers obtained by this mapping operation are a suitable representation of phase relation information. Combining the phase relation information can advantageously take place simply by adding these integers, and most preferably by means of a modulo N addition. In the embodiment shown in FIG. 3 this will lead to the following result: The message M1(T1) will carry the integer 2. The combined phase relation information carried in the message M2(T1+T2) is 2+1 mod 3=0 which indicates that the node 3 is connected to the same wiring phase as the reference phase. The operation 0+1 mod 3 performed at node 4 will then reveal that node 4 is one phase behind the reference phase, that is node 4 is connected to the phase voltage S. Accordingly, the message M3 transmitted back to the reference node 1 simply contains the integer 1.

It has to be noted that while the integer representation of the phase relation information just described is a particularly advantageous implementation in terms of computational complexity, there are of course other possibilities to represent the phase relation information obtained from the measurement of the time intervals T1, T2 and T3. Other representations would include the explicit time intervals in terms of seconds or in terms of phase angle or any other suitable representation. The exemplary embodiment in FIG. 3 distinguishes between three wiring phases R, S and T. If inverse phase wirings are to be considered as additional wiring possibilities, then this will result in six different phases, i.e. N=6.

In this case, the reference points of the inverse phase voltages (not shown in the figure) will coincide with the points R−, S− and T− shown in FIG. 2.

In the embodiment of FIG. 2, the message portions M1, M2 and M3 and the time stamp TS are respectively integrated into a single message S1, S2, S3 and S4. Alternatively, it would be possible to transmit the time stamp signal TS and the associated message portion M1 in separate messages, there being no necessity to transmit the message portions M1 to M3 at a specified timing.

The message S1 shown in FIG. 2 does not comprise a message portion, because this message has been generated by the reference node and need not carry any additional phase relation information. Nevertheless, in order to obtain a unified communication protocol, it may be advantageous to provide also the message S1 with a message portion which may contain dummy information. The message S4 is shown in FIG. 2 without a time stamp signal, because this message serves to report the combined phase relation information obtained at node 4 back to the reference node 1 for which a specified timing is not required. Nevertheless, again for the sake of a unified communication protocol it may be advantageous to build the message S4 with a time stamp similar to the other messages, and to transmit the message S4 such that its time stamp coincides with a reference point in the wiring phase of the node S4.

Figure 3:
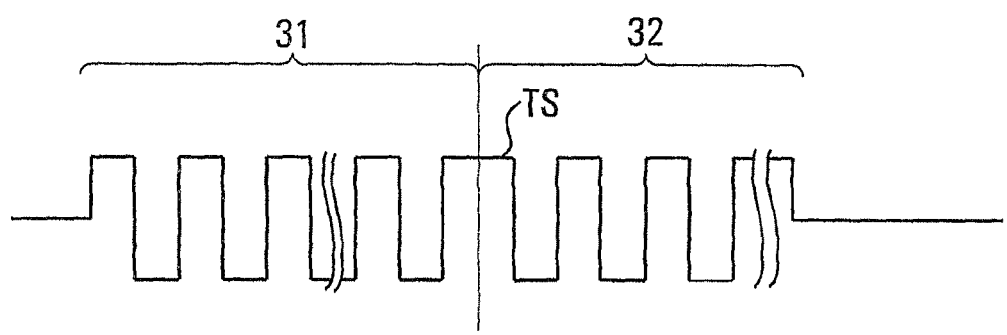
FIG. 3 shows an example embodiment of a time stamp signal.

FIG. 3 shows an embodiment of a time stamp signal. The signal shown in FIG. 3 consists of first portion 31 and a second portion 32. The first portion 31 comprises an alternating signal pattern at a specified frequency. The portion 32 comprises a signal pattern at the same specified frequency, however, with an inverse phase relative to the phase of the signal pattern 31. The phase discontinuity between the first portion 31 and the second portion 32 constitutes the time stamp TS.

Figure 4:
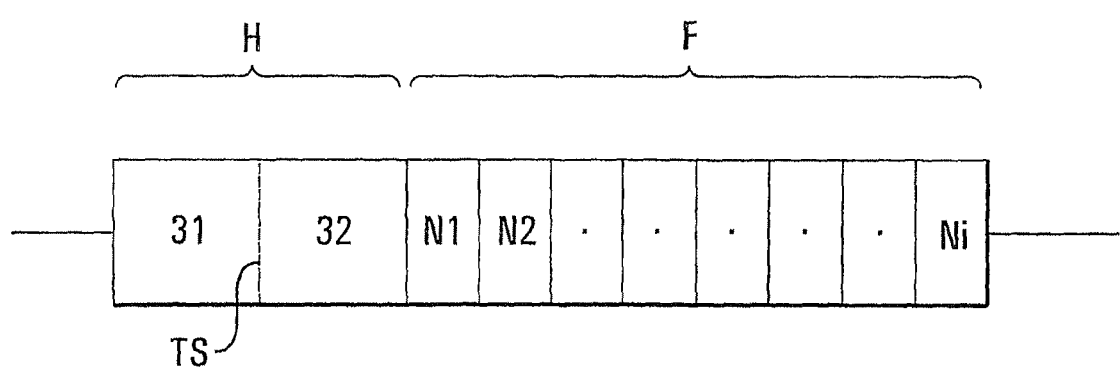
FIG. 4 shows a message signal comprising a time stamp signal and a message portion.

FIG. 4 shows an embodiment of a message signal which integrates a time stamp signal and a message portion. In FIG. 4, reference numeral 31 and 32 denote the signal sections described above with reference to FIG. 3. TS denotes a time stamp in the form of a phase discontinuity between the signal portions 31 and 32. The two signal portions 31 and 32 constitute a header H which is useful for establishing bit synchronization. Reference character F in FIG. 4 denotes a message field. The message field F may comprise a plurality of message sub fields N1, N2, . . . , Ni. Advantageously, the messages S1 to S4 shown in FIG. 2 are structured in accordance with the embodiment of FIG. 4. Each of the message fields N1 to Ni comprises phase relation information as described in connection with FIG. 2, and furthermore the address of the node where this phase relation information has been obtained as described above, that is by combining received phase relation information and a measured time interval. Advantageously, each node that receives phase relation information and combines the received phase relation information with information obtained from measuring a time interval between the time stamp and a reference point on its wiring phase, appends the combined phase relation information thus obtained together with its own node address to the message that it relays to the next node. In this way, the message S4 in FIG. 2 from the node 4 back to the node 1 in FIG. 1 comprises phase relation information that allows the node 1 to obtain the wiring phase of all the nodes involved in the wiring phase detection of node 4.

FIG. 5 shows a block diagram of a node forming part of the system shown in FIG. 1. In FIG. 5 the reference characters R, S, T and N denote the three phases and neutral, respectively, of the power line L, as explained before. The node shown may be connected to one or all of the three phases. TR denotes a transceiver circuit for establishing power line communication via the power line L. CCT, CCS and CCR denote coupling capacitors, which allow the transceiver circuit TR to transmit and receive power line communication signals from those phases of the power line L to which the node is connected. Of course, alternatively inductive coupling means may be used for this purpose, for example coupling transformers, as is well known as such. Power line communication signals may be injected into and extracted from one conductor only or into/from more or all conductors of the power line, on each phase with a separate transceiver front end or with a single transceiver front end for all lines in parallel. ZD denotes a reference point detector, for example a zero crossing detector circuit which is connected to detect zero crossings at a specified one of the three phases R, S and T to which the node shown in FIG. 5 is connected. The specified phase is that phase of the node the wiring of which is to be detected. MC denotes a micro controller circuit. MEM denotes a memory section, and TM denotes a timer circuit. IF denotes an interface circuit for interfacing the node shown in FIG. 5 with other circuitry not shown in the Figure, e.g. circuitry for metering the consumption of electricity or for performing any other function not directly related to the principles of the technology described. B denotes a bus for exchanging data and address information between the micro controller unit MC, the memory section MEM, the transceiver circuit TR, the zero crossing detector ZD, the timer TM and the interface circuit IF. IRQ denotes an interrupt request line to notify the micro controller unit MC of interrupts generated by the transceiver circuit TR and the zero detector circuit ZD, respectively, as will be explained in the following.

The node shown in FIG. 5 operates under software control in accordance with program data stored in the memory section MEM to perform operations as described above with reference to FIG. 2. If the node of FIG. 5 is controlled to act as the node 1 at the reference location, that phase to which the input IN1 of the zero crossing detector ZD is connected, will be the reference phase for performing the wiring phase detection, that is phase R in FIG. 5. Whenever the zero crossing detector ZD detects a zero crossing with positive slope, ZD generates an interrupt request on the line IRQ for the micro controller MC and places information on the bus B that a zero crossing with a specified slope has occurred. In response to the interrupt request, the micro controller will read information from bus B concerning the source of the interrupt and then instruct the transceiver circuit TR to place a predetermined signal pattern on the power line L which contains a time stamp, e.g. as explained above in connection with FIG. 3 or FIG. 4. The node at the reference location 1 preferably also transmits a message which contains an address of the remote node 4 the phase wiring of which is to be detected. Advantageously, each message transmitted by a node contains not only the remote node address but a list of node addresses of all nodes involved in the detection of the wiring phase of the remote node 4 as well as an address pointer field which contains the address of the respective next node to which the message is to be addressed. Each node contained in the list updates the address pointer field in accordance with the entries in the list of node addresses to achieve that the relay messages follow a sequence of nodes defined in the node address list.

The transceiver circuit TR will listen to communication on the power line L. Whenever the transceiver circuit TR receives a message addressed to its own node, it will perform the necessary demodulation and decoding steps, inform the micro controller MC about the reception of a new message and place the received data on the bus B. If the micro controller MC identifies the message to be a return message S4 from a remote-node the phase wiring of which is to be detected, the micro controller MC will evaluate the information contained in the received message in accordance with the operations described above to obtain the phase wiring of the remote node, and store the result in the memory section MEM.

If the node shown in FIG. 5 receives a wiring phase detection message, the transceiver circuit TR receives such a message, informs the micro controller MC via an interrupt request of the received message and places its content on the data bus B as before. The micro controller MC evaluates the address and message content to determine whether the message has to be relayed to-another node. If so, it then instructs the timer TM to begin a time measuring operation. At the occurrence of a reference point on the phase to which the zero detector circuit of the node is connected, a further interrupt request is generated to the micro controller, this time by the zero crossing detector, and in response to this interrupt request the micro controller will then stop the time measuring operation of the timer circuit TM and suitably process the data concerning the time interval measured by the timer circuit TM in accordance with the principles described above. The time information thus obtained and phase relation information extracted from the received message are then combined under program control by the micro controller MC, and a new message is assembled by the micro controller MC which contains the resulting combined phase relation information. This message is made available to the transceiver circuit TR through the data bus B. At the occurrence of a further reference point in the phase to which the zero crossing detector ZD is connected, the micro controller MC then instructs the transceiver circuit TR to generate and transmit a message that contains a time stamp and the combined phase relation information as well as the address of that node the wiring phase of which is to be detected, which address was contained in the previously received message. Advantageously, as explained before, the message also contains said list of addresses of said address pointer field that was updated by the node to indicate the address of the next node for the message.

On the other hand, if the micro controller determines from the address and content of a received message that it contains a wiring phase detection request concerning its own node, the micro controller MC extracts the phase relation information contained in the received message and measures the time between the time stamp in the received message and the occurrence of a reference point in the phase to which the zero crossing detector ZD is connected, according to the same principles as described before, using the timer circuit TM. The result of this time interval measurement is then combined by the micro controller MC with the phase relation information in the received message. The combined phase relation information thus obtained is then included by the micro controller in a return message generated by the transceiver circuit TR to inform the reference node about the phase wiring of the present node relative to the reference phase of the requesting node.

According to the embodiment shown in FIG. 5, each of the nodes 1 to 4 has essentially the same configuration and operates under software control by virtue of a micro controller in accordance with the message content it has received. At least one node is adapted to generate a wiring phase detection request message addressed to a specified remote node, as described. Any node involved in the relay process that receives a wiring phase detection request message not for itself but for a different node, will take the received message and perform a relay operation as described before. A node that receives a wiring phase detection request message for itself, will perform the operations as described to return a message to the requesting node where the wiring phase detection request message originated in order to inform that node about its own wiring phase relative to the wiring phase of the requesting node.

When a zero crossing triggers the generation of a time stamp signal, a time offset may occur between the zero crossing and the time stamp. This offset may be due to a header preceding the actual time stamp, as shown for example in FIG. 3, and/or due to a limited processing speed of the micro controller MC. The effect of this is that the time stamp and the associated zero crossing do not perfectly coincide. If the number of phase wiring possibilities is low (e.g. N=3), this offset may be negligible. A simple solution to compensate the delay between the zero crossing and the associated time stamp is, to add to each measured time interval the known offset.

Figure 6A:
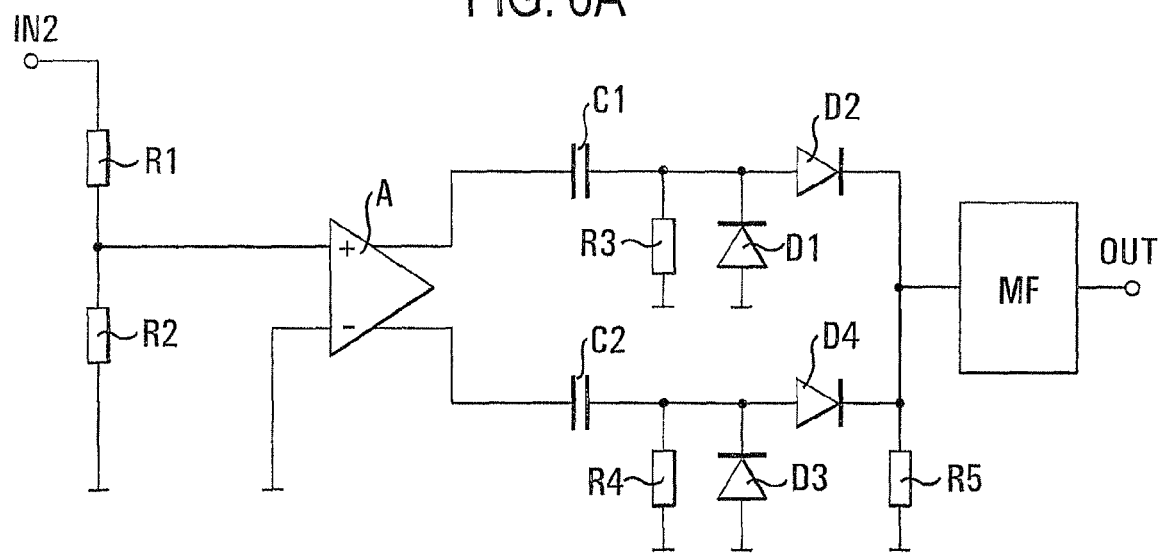
FIG. 6A shows an embodiment of a circuit for detecting time stamps in a phase voltage

FIG. 6A shows an embodiment of a time stamp detector circuit for detecting a time stamp signal shown in FIG. 3. The time stamp detector circuit of FIG. 6A may be a part of the transceiver circuit TR in FIG. 5. In FIG. 6A, IN2 denotes the input of the time stamp detector circuit. This input is connected to receive an input signal from the receiver and demodulator (not shown) of the transceiver circuit TR in FIG. 5. R1 and R2 denote two resistors connected to constitute a voltage divider. A denotes an operational amplifier or comparator the positive input of which is connected to the output of the voltage divider R1, R2 and the negative input of which is connected to ground. C1 and R3 denote a capacitor and a resistor, respectively, which are connected to differentiate an output signal at the negative output of the operational amplifier A. Similarly, C2 and R4 denote a differentiator which is connected to differentiate an output signal at the positive output of the amplifier A. D1 denotes a diode connected in parallel with the resistor R3 such that the cathode of this diode is connected to the capacitor C1 while the anode is connected to ground. D3 denotes a diode which is connected in parallel to the resistor R4 such that the cathode of diode D3 is connected with the capacitor C2 while the anode of diode D3 is connected to ground. The cathode of diode D1 is connected with the resistor R5 through a further diode D2. The cathode of diode D3 is connected to the same node of the resistor R5 through a diode D4. This node of the resistor R5 is connected with the input of a retriggerable monoflop MF. The other output of the resistor R5 is connected to ground. The output of this monoflop constitutes the output OUT of the time stamp detector circuit. The retriggerable monoflop has a time period of about 1.5 times the duration between two regular consecutive edges of the signal section 31 shown in FIG. 4.

Figure 6B:
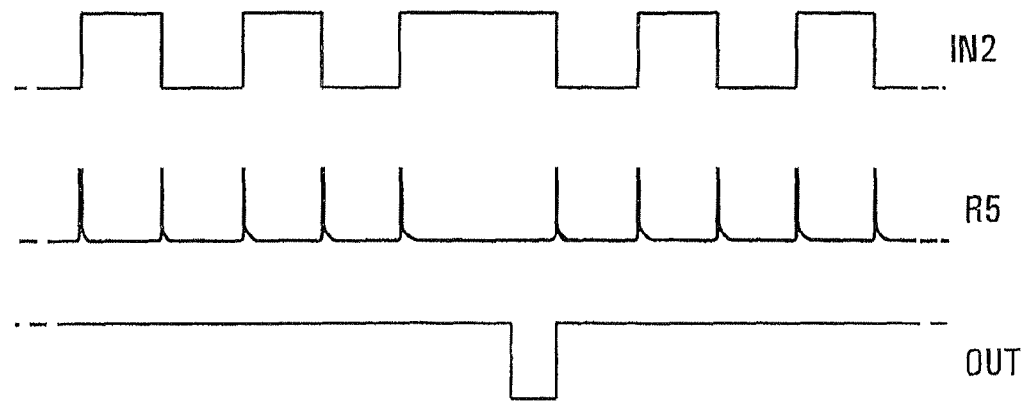
FIG. 6B is a timing diagram illustrating the operation of the circuit shown in FIG. 6A.

FIG. 6B illustrates the operation of the time stamp detector of FIG. 6A. The upper diagram in FIG. 6B shows the voltage wave form at the input IN2 of the time stamp detector. The operational amplifier A converts this input signal into complementary digital signals at its positive and negative outputs. The differentiator and the subsequent diode network connected to the respective outputs emphasize only the positive edges in the output signals of the respective outputs. These differentiated and rectified signals are combined at the resistor R5, this leading to an output signal across the resistor R5 as shown in the middle of FIG. 6B. The signal across resistor R5 triggers the retriggerable monoflop which will maintain its triggered state as long as the pulses across R5 are regularly spaced, as shown. As soon as the time stamp occurs, i.e. the phase inversion in the signal at the input IN2, a pulse across R5 will be missing such that the monoflop MF will fall back into the reset state and thus generate a detection signal at the output OUT. In order to avoid spurious output pulses at the output OUT, it is preferable to mask the output signal at OUT by means of an AND gate with a control signal that indicates a locked state when detecting the preamble 31 of the time stamp signal.

Alternative implementations of a time stamp detector circuit may be based on integrating the signal at the input IN2 and comparing the integrated signal with a threshold that will be reached when the duration of a signal segment of constant amplitude is longer than usual, i.e. when the phase inversion occurs. Other alternatives of detecting the time stamp signal according to the embodiment of FIG. 3 may adopt a digital signal pattern detector or any other suitable circuit known per se.

The zero crossing detector ZD may be implemented in a variety of ways well known as such. A suitable implementation of the zero crossing detector ZD comprises a circuit having a comparator, a differentiator and a rectifier connected to its output, essentially similar to the capacitor, resistor and diode network connected to one of the two outputs of the comparator A shown in FIG. 6A The technology described is not limited to the particular phase relation detection mechanisms herein described. A person skilled in the art will appreciate that any phase relation detection mechanism which provides phase relation information between two consecutive locations, can be employed in the wiring phase detection. The technology described is not limited to the time stamp signal herein described or to a particular time stamp detection circuit. It has to be emphasized that the circuits and signals shown merely serve the purpose of illustrating non-limiting, example embodiments. Reference signs in the claims serve to increase their intelligibility. They shall not be construed as limiting.

The invention claimed is:

1. A method for detecting in an electrical power distribution system having a power line with a single phase or poly phase wiring, the wiring phase at a remote location relative to a reference wiring phase at a reference location, the method comprising the steps:

connecting at least one relay location to a wiring phase of said poly-phase power line at a location between said reference location and said remote location, detecting a first phase relation between the reference wiring phase voltage at the reference location and the wiring phase voltage at a said relay location;

detecting a second phase relation between a wiring phase voltage at a said relay location and a wiring phase voltage at said remote location;

determining the wiring phase of said remote location relative to the wiring phase at said reference location based on said first phase relation and said second phase relation;

transmitting from said relay location said detected first phase relation towards said remote location;

receiving said first phase relation at a further relay location arranged between said relay location and said remote location;

detecting a further phase relation between the wiring phase voltage at said relay location and the wiring phase voltage at said further relay location; and combining the further phase relation information and the first phase relation information.

2. The method according to claim 1, wherein said step of detecting a first phase relation comprises:

transmitting from said reference location a first time stamp signal when a first reference point in said reference wiring phase voltage occurs;

receiving at said relay location said first time stamp signal;

measuring a first time interval between the occurrence of said first time stamp signal and the occurrence of a reference point in a wiring phase voltage at said relay location to obtain said first phase relation between said reference wiring phase voltage and said wiring phase voltage.

3. The method according to claim 2, wherein said reference points are zero crossings of the respective phase voltages.

4. The method according to claim 3, wherein said reference points are zero crossings of said respective phase voltages with a slope of specified sign.

5. The method according to claim 2, wherein said time stamp signal is short in comparison with a phase voltage period, corresponding to a voltage signal waveform period of a wiring phase voltage, divided by a number of wiring phase possibilities to be distinguished.

6. The method according to claim 2, wherein said time stamp signal is a repetitive signal pattern comprising one or more of a phase discontinuity, an amplitude discontinuity, or a frequency discontinuity.

7. The method according to claim 2, wherein said time stamp signals are transmitted via said power line by injection into one or more conductors of said power line by capacitive or inductive coupling.

8. The method according to claim 7, wherein said time stamp signals are injected into that phase voltage of the power line for which the injected, time stamp signal indicates the occurrence of a reference point.

9. The method according to claim 1, wherein said step of detecting a second phase relation comprises:

transmitting from said relay location a relay time stamp signal when a reference point in said wiring phase voltage of said relay location occurs;

receiving at said remote location said relay time stamp signal; and measuring at said remote location the time interval between the occurrence of said relay time stamp signal and the occurrence of a reference point in the wiring phase voltage of said remote location.

10. The method according to claim 1, comprising said remote location generating a return message for communicating its wiring phase to the reference location.

11. The method according to claim 1, wherein said phase relation information is transmitted through radio communication channels or optical cable between said locations.

12. The method according to claim 1, wherein said step of transmitting said first phase relation towards said remote location comprises generating a relay message which comprises said first phase relation information and transmitting from said relay location said relay message via said power line or via optical cable or via communication channels, the method further comprising:

generating a further relay message which comprises a combination of previously obtained phase relation information, and transmitting said further relay message towards said remote location.

13. The method according to claim 1, wherein each phase relation information comprises a respective phase angle value, and said phase relation information and said further phase relation information are combined using modulo addition of respective phase angle values.

14. The method according to claim 1, wherein said step of transmitting said first phase relation towards said remote location comprises generating a relay message which comprises said first phase relation information and transmitting from said relay location said relay message via said power line or via optical cable or via radio communication channels, and wherein said relay message comprises a time stamp field containing a time stamp signal and an information field containing said phase relation information.

15. The method according to claim 14, wherein said time stamp field acts as a header for the information field to establish bit synchronization.

16. The method according to claim 14, wherein said information field carries a dual tone multiple function signal containing said phase relation information.

17. The method according to claim 14, wherein said relay message comprises information identifying its sender.

18. The method according to claim 17, wherein each time stamp signal and/or each message comprises a list of nodes which have previously relayed the time stamp signal.

19. A relay apparatus for detecting the wiring phase at a remote location relative to a reference wiring phase voltage of a reference location in an electrical power distribution system having a power line with a single phase or poly phase wiring, comprising:

circuitry adapted to detect a first phase relation between the wiring phase at the reference location and the wiring phase at a relay location;

circuitry adapted to communicate with said remote location in detecting a second phase relation between a wiring phase voltage at said relay location and a wiring phase voltage at said remote location;

circuitry adapted to receive phase relation information; and circuitry adapted to combine said detected first phase relation information and said received phase relation information and transmit said combined phase relation towards said remote location.

20. The relay apparatus according to claim 19, wherein said circuitry adapted to detect a first phase relation between the wiring phase at the reference location and the wiring phase at a relay location comprises:

circuitry adapted to receive a first time stamp signal; and circuitry adapted to measure a time interval between the occurrence of said time stamp signal and the occurrence of a reference point in the wiring phase voltage at said relay location to obtain a phase relation between said wiring phase at the reference location and said wiring phase at said relay location.

21. The relay apparatus according to claim 20, further comprising circuitry adapted to transmit said detected first phase relation towards said remote location and to generate and transmit a relay message which comprises said first phase relation information.

22. The relay apparatus according to claim 19, wherein said circuitry adapted to communicate with said remote location in detecting a second phase relation comprises:

circuitry adapted to generate and transmit a relay time stamp signal when a second reference point in said wiring phase voltage at the relay location occurs.

23. The relay apparatus according to claim 19, wherein said circuitry adapted to combine said received phase relation information and said detected phase relation information is adapted to generate a relay message that comprises said combined phase relation information.

24. A remote meter for remote metering the consumption of utilities in a utility distribution system, comprising the relay apparatus according to claim 19.

25. The remote meter in claim 24, wherein the remote meter is configured for remote metering consumption of at least one of electricity, water, or gas.

26. An apparatus for detecting at a remote location the phase wiring of an arbitrary unknown phase voltage relative to a reference phase voltage in an electrical power distribution system having a single phase or poly phase power line, comprising:

a circuit for receiving a time stamp signal;

a circuit for measuring a time interval between the occurrence of said time stamp signal and the occurrence of a reference point in said arbitrary unknown wiring phase voltage of said power line to obtain phase relation information indicative of a phase relation between said time stamp signal and said arbitrary unknown phase voltage;

a circuit for receiving a relay message comprising phase relation information indicative of a phase relation between said reference phase voltage and said time stamp signal;

a circuit for combining said phase relation information indicative of a phase relation between said time stamp signal and said arbitrary phase voltage and said received phase relation information; and a circuit for determining the phase wiring of said unknown arbitrary unknown phase voltage from said combined phase relation information.

27. A remote meter for remote metering the consumption of utilities in a utility distribution system, comprising the apparatus according to claim 26.

28. The remote meter in claim 27, wherein the remote meter is configured for remote metering consumption of at least one of electricity, water, or gas.

29. A system for detecting the wiring phase of an unknown phase voltage at a remote location relative to a reference phase voltage in an electrical power distribution system having a poly phase power line, the system comprising:

means for transmitting from a first location towards said remote location a first time stamp signal when a first reference point in said reference phase voltage occurs;

means for receiving at a relay location said first time stamp signal;

means for measuring a first time interval between the occurrence of said first time stamp signal and the occurrence of a reference point in a first arbitrary wiring phase voltage of said power line to obtain first phase relation information indicative of a phase relation between said reference phase voltage and said first arbitrary phase voltage;

means at said relay location for generating and transmitting towards said remote location a relay message comprising said phase relation information;

means at a further relay location arranged between said relay location and said remote location, for receiving said first phase relation, detecting a further phase relation between the wiring phase voltage at said relay location and the wiring phase voltage at said further relay location, and combining the further phase relation information and the first phase relation information; and means for generating and transmitting at said further relay location towards said remote location a further relay time stamp signal when a second reference point in said first arbitrary phase voltage occurs, and for generating a further relay message comprising a combination of said first phase relation information and said further phase relation information.

\* \* \* \* \*